United States Patent
Melis et al.

(10) Patent No.: US 10,024,895 B1
(45) Date of Patent: Jul. 17, 2018

(54) REAL-TIME SPECTRUM ANALYZER HAVING FREQUENCY CONTENT BASED TRIGGER UNIT

(71) Applicant: Agilent Technologies, Inc., Loveland, CO (US)

(72) Inventors: Joeri Melis, Herent (BE); Gery Verhaegen, Rotselaar (BE)

(73) Assignee: Keysight Technologies, Inc., Santa Rosa, CA (US)

( * ) Notice: Subject to any disclaimer, the term of this patent is extended or adjusted under 35 U.S.C. 154(b) by 1385 days.

(21) Appl. No.: 13/833,165

(22) Filed: Mar. 15, 2013

(51) Int. Cl.
*G01R 23/16* (2006.01)
*G01R 23/18* (2006.01)
*G01R 13/02* (2006.01)
*G01R 13/34* (2006.01)

(52) U.S. Cl.
CPC ............. *G01R 23/16* (2013.01); *G01R 13/02* (2013.01); *G01R 13/0254* (2013.01); *G01R 13/345* (2013.01); *G01R 23/18* (2013.01)

(58) Field of Classification Search
CPC .... G01R 23/16; G01R 23/18; G01R 13/0254; G01R 13/02; G01R 13/345
USPC .......................................................... 702/65
See application file for complete search history.

(56) References Cited

U.S. PATENT DOCUMENTS

| | | | |
|---|---|---|---|
| 4,870,348 A * | 9/1989 | Smith | G01R 23/18 324/76.19 |
| 5,103,402 A * | 4/1992 | Morton | G01R 23/16 702/76 |
| 7,251,577 B2 | 7/2007 | Bernard et al. | |
| 7,738,659 B2 | 6/2010 | Moskowitz | |
| 7,873,486 B2 | 1/2011 | Earls | |
| 8,180,586 B2 | 5/2012 | Hillman, Jr. et al. | |
| 2006/0025947 A1 | 2/2006 | Earls | |
| 2010/0235124 A1* | 9/2010 | Tracy | G01R 13/0263 702/76 |

(Continued)

FOREIGN PATENT DOCUMENTS

WO 2013/023952 A1 2/2013

OTHER PUBLICATIONS

Non-Final Office Action dated Nov. 5, 2014 for U.S. Appl. No. 13/745,008, 33 pages.

(Continued)

*Primary Examiner* — Gregory J Toatley
*Assistant Examiner* — Terence Stifter, Jr.

(57) ABSTRACT

A real-time spectrum analyzer includes an ADC for providing digitized time domain data, an acquisition control unit for selectively acquiring the time domain data, a processing unit and a display unit. The processing unit includes a domain conversion engine configured to convert the acquired time domain data to frequency domain data, first and second display engines configured to generate first and second display data according to first and second display modes, a frequency content based trigger unit configured to generate a frequency content based trigger signal when the frequency domain data meet a first predetermined trigger condition, and a trigger based enabler configured to generate an enable signal for selectively gating the second display engine in response to the frequency content based trigger signal, such that the second display engine stops generating the second display data, while the first display engine continues to generate the first display data.

20 Claims, 8 Drawing Sheets

(56) References Cited

U.S. PATENT DOCUMENTS

| | | |
|---|---|---|
| 2011/0246134 A1 | 10/2011 | Frishberg et al. |
| 2011/0274150 A1* | 11/2011 | Dement .................. G01R 23/16 375/224 |
| 2012/0128257 A1 | 5/2012 | Quan |
| 2012/0213438 A1 | 8/2012 | Quan |
| 2012/0306886 A1* | 12/2012 | Bernard .................. G09G 5/39 345/440.1 |
| 2013/0158923 A1* | 6/2013 | Stanton .................. G01R 23/18 702/76 |

OTHER PUBLICATIONS

Notice of Allowance dated May 22, 2015 for U.S. Appl. No. 13/745,008, 9 pages.

* cited by examiner

REAL-TIME SPECTRUM ANALYZER HAVING FREQUENCY CONTENT BASED TRIGGER UNIT

BACKGROUND

A conventional real-time spectrum analyzer generally receives a time domain input signal from a device under test (DUT) and displays corresponding frequency domain spectra, where each frequency domain spectrum represents a corresponding time interval. The spectra may be obtained by performing fast Fourier transforms (FFTs) on digital time domain data representing the time domain input signal.

In a conventional real-time spectrum analyzer, the signal from the DUT is first digitized and provided to an acquisition control unit. The acquisition control unit may use internal or external trigger inputs, including a frequency mask trigger, for example, to determine whether or not to acquire new data. The acquired time domain data are converted into the frequency domain data, which is processed for display using various visualization algorithms.

The frequency mask trigger included in the conventional real-time spectrum analyzer provides triggered measurements and/or displays. The frequency mask trigger is configured to detect a trigger condition in the spectra based on a frequency mask having various levels fixed to absolute frequency points. When the trigger condition is detected, a fixed amount of the frequency domain data displayed (and stored), and then the trigger is re-armed. Although a real-time spectrum analyzer makes it relatively easy to isolate specific occurrences, it does not provide the ability to easily separate specific events from a complex signal stream when those events are not clearly separated in frequency from other events. When such events are not clearly separated in frequency, a user must provide program the real-time spectrum analyzer for custom analysis, reprogram the DUT and/or change the test environment, so that the specific events can be easily separated from other signal events.

SUMMARY

In a representative embodiment, a real-time spectrum analyzer for measuring time domain data sampled from an input signal includes an analog-to-digital converter (ADC) configured to digitize the input signal to provide digital time domain data in a time domain, an acquisition control unit configured to selectively acquire the time domain data provided by the ADC, a processing unit and a display unit. The processing unit includes a domain conversion engine configured to convert the acquired time domain data to corresponding frequency domain data representing a waveform of the input signal in a frequency domain, a first display engine configured to generate first display data from the frequency domain data according to a first display mode, a second display engine configured to selectively generate second display data from at least a portion of the frequency domain data according to a second display mode, a frequency content based trigger unit configured to generate a first frequency content based trigger signal when the frequency domain data meet a first predetermined trigger condition, and a first trigger based enabler configured to generate a first enable signal for selectively gating the second display engine in response to the first frequency content based trigger signal, such that the second display engine stops generating the second display data in response to the first enable signal, while the first display engine continues to generate the first display data. The display unit is configured to display at least one of a first image visualizing the first display data and a second image visualizing the second display data.

In another representative embodiment, a method executed by a real-time spectrum analyzer is provided for performing real-time separation of signal components of an input signal. The method includes digitizing the input signal to obtain time domain data; acquiring the time domain data; converting the acquired time domain data to corresponding frequency domain data representing a waveform of the input signal in a frequency domain; generating first display data from the frequency domain data according to a traditional display mode; generating second display data from the frequency domain data according to one of a persistence display mode or a spectrogram display mode; generating a first frequency content based trigger signal when the frequency domain data meets a first predetermined trigger condition; generating a first enable signal in response to the first frequency content based trigger signal; pausing the generating of the second display data in response to the first enable signal, while continuing to generate the first display data; and displaying at least one of a first image visualizing the first display data and a second image visualizing the second display data.

In another representative embodiment, a real-time spectrum analyzer for measuring time domain data sampled from an input signal includes a domain conversion engine, multiple display engines, a frequency content based trigger unit, and first and second trigger based enablers. The domain conversion engine is configured to convert digitized time domain data to corresponding fast Fourier transform (FFT) spectra representing a waveform of the input signal in a frequency domain. The display engines configured to generate a plurality of display data from the FFT spectra according to a corresponding plurality of display modes. The frequency content based trigger unit is configured to apply first and second masks defining first and second predetermined trigger conditions, and to generate a first frequency content based trigger signal when an FFT point in at least one FFT spectrum meets the first predetermined trigger condition, and to generate a second frequency content based trigger signal when an FFT point in at least one FFT spectrum meets the second predetermined trigger condition. The first trigger based enabler is configured to generate a first enable signal for selectively gating one of the plurality of display engines in response to the first frequency content based trigger signal, independent of at least one other display engine. The second trigger based enabler is configured to generate a second enable signal for selectively gating another one of the plurality of display engines in response to the second frequency content based trigger signal, independent of at least one other display engine.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, illustrative embodiments disclosing specific details are set forth in order to provide a thorough understanding of embodiments according to the present teachings. However, it will be apparent to one having had the benefit of the present disclosure that other embodiments according to the present teachings that depart from the specific details disclosed herein remain within the scope of the appended claims. Moreover, descriptions of well-known devices and methods may be omitted so as not to obscure the description of the example embodiments. Such methods and devices are within the scope of the present teachings. Generally, it is understood that the drawings and the various elements depicted therein are not drawn to scale.

Figure 1:
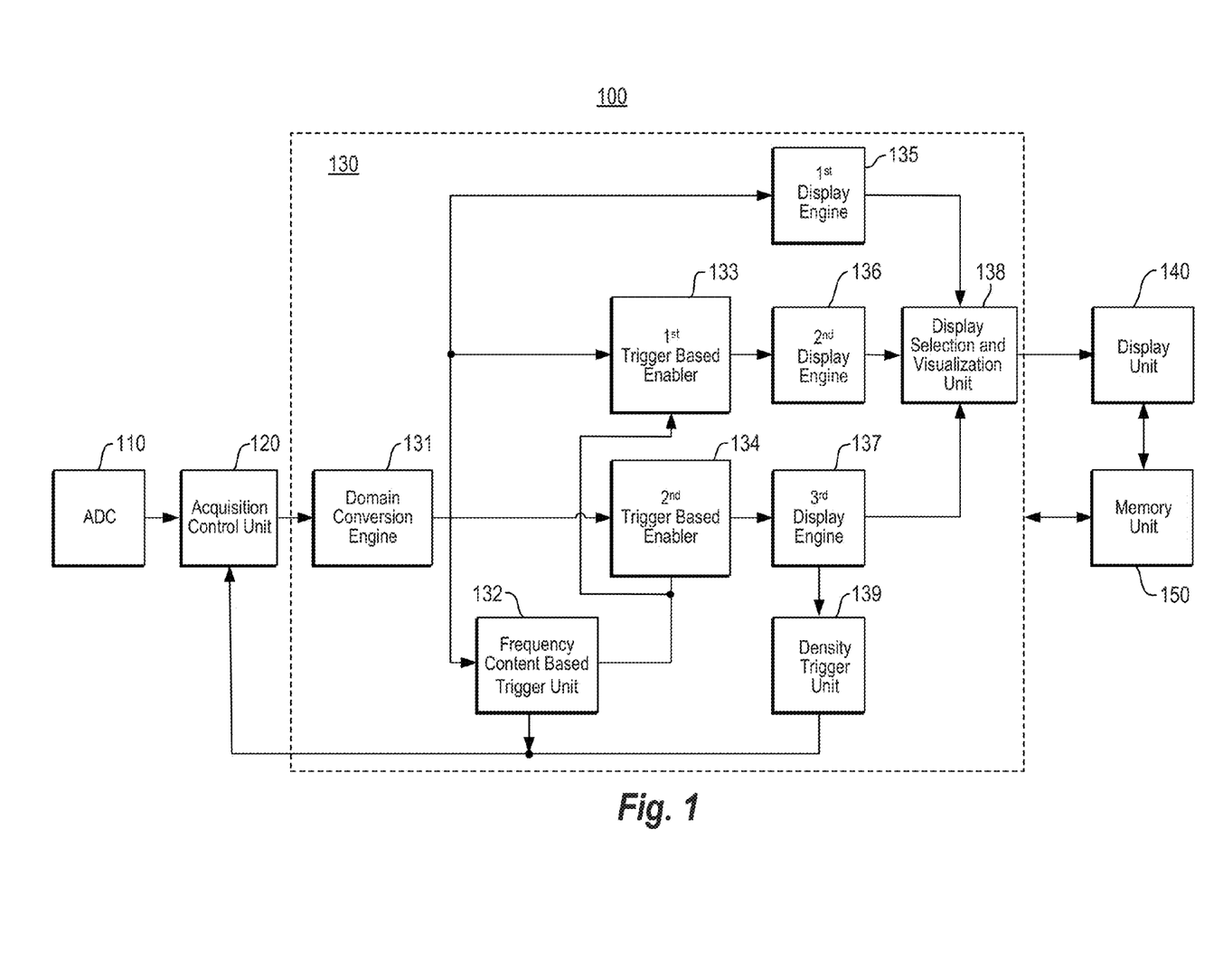
FIG. 1 is a simplified block diagram of a real-time spectrum analyzer, according to a representative embodiment.

FIG. 1 is a simplified block diagram of a real-time spectrum analyzer, according to a representative embodiment.

Referring to FIG. 1, real-time spectrum analyzer 100 includes analog-to-digital converter (ADC) 110, acquisition control unit 120, processing unit 130, and display unit 140. The ADC 110 is configured to sample and digitize an input signal, e.g., received from a device under test (DUT) being analyzed by the real-time spectrum analyzer 100, outputting digital time domain data representing the input signal in the time domain. The acquisition control unit 120 is configured to selectively output the digital time domain data from the ADC 110 to the processing unit 130 in response to a frequency content based trigger and/or a density trigger provided by the processing unit 130, as discussed below. Generally, in the absence of a frequency content based trigger and a density trigger, the acquisition control unit 120 provides a continuous a stream of digital time domain data to the processing unit 130.

In the depicted embodiment, the processing unit 130 includes a domain conversion engine 131 configured to convert the acquired time domain data to corresponding frequency domain data representing a waveform of the input signal in the frequency domain. The domain conversion engine 131 may be a fast Fourier transform (FFT) engine, for example, for performing fast Fourier transforms on the time domain data received from the acquisition control unit 120 to provide a stream of FFT spectra. Each FFT spectrum includes multiple FFT points corresponding to data within a time interval, where each FFT point includes a frequency and corresponding amplitude of the input signal. The frequency domain data are output by the domain conversion engine 131 to a number of components within the processing unit 130, including a frequency content based trigger unit 132, a first display engine 135, a second display engine 136 (via first trigger based enabler 133), and a third display engine 137 (via second trigger based enabler 134).

The first display engine 135 is configured to generate first display data from the frequency domain data received directly from the domain conversion engine 131 according to a first display mode. For example, in the depicted embodiment, the first display mode is a traditional display mode, where a single spectrum is displayed on a grid with frequency distributed along the X-axis and amplitude along the Y-axis. The first display engine 135 receives the frequency domain data directly from the domain conversion engine 131, and is not subject to application of enable signals from the first trigger based enabler 133 or the second trigger based enabler 134 in response to the frequency content based trigger unit 132. Thus, the stream of the frequency domain data to the first display engine 135 is controlled by the acquisition control unit 120.

In an alternative embodiment, the first display mode implemented by the first display engine 135 may be a modified traditional display mode, in which the first display data include two or more spectra to be displayed simultaneously. The most recently acquired spectrum is displayed with maximum brightness, while the previously acquired spectrum continues to be displayed (rather than erased completely), but at a lower level of brightness. When more than two spectra are to be displayed, the brightness levels of the spectra incrementally decrease for the earlier acquired spectra, until the spectra disappear completely. That is, the older the spectrum, the lower the brightness level. In this modified traditional display mode, the frequency content based trigger unit 132 may provide a frequency content based trigger to the acquisition control unit 120 to enable/disable acquisition of the frequency domain data, so that only desired spectra are included.

The second display engine 136 is configured to generate second display data from the frequency domain data received from the domain conversion engine 131 (under control of the first trigger based enabler 133, as discussed below), according to a second display mode. For example, in the depicted embodiment, the second display mode is a spectrogram display mode. Generally, a spectrogram display is an assembly of multiple spectrum displays, where the two dimensional spectrum display image is reduced to a single line with amplitude (e.g., along the Y-axis) is converted into different colors. For each new spectrum, a new line is added to the spectrogram display, allowing multiple spectra (e.g., about 1000) to be shown at any given time. In comparison, the traditional display mode typically provides a single spectrum. Use of a spectrogram display in real-time may be difficult, since typical displays capture too many spectra and thus the amount of new lines introduced is too high for the display (and the human eye) to track. Therefore, a capture rate reduction or a single step approach may be incorporated. Capture rate reduction may be performed by averaging or some other means, but either introduces gaps and/or reduces the analysis bandwidth. In the single step approach, a trigger may be used to stop the acquisition control unit 120 and a user can view/scroll through the spectrogram.

The third display engine 137 is configured to generate third display data from the frequency domain data received from the domain conversion engine 131 (under control of the second trigger based enabler 134, as discussed below), according to a third display mode. For example, in the depicted embodiment, the third display mode is a persistence display mode. A persistence display is an image where the underlying data form a matrix of occurrence values. Each time a new spectrum is acquired, the occurrence of each FFT point in that spectrum is increased. After sufficient spectra are acquired, the display shows which FFT points (in frequency and amplitude) were hit and how often. Of course, a different number and/or types of display engines may be incorporated, without departing from the scope of the present teachings.

The processing unit 130 further includes a display selection and visualization unit 138, which receives the first display data from the first display engine 135, the second display data from the second display engine 136 and the third display data from the third display engine 137. The display selection and visualization unit 138 is configured to select one or more of the first, second and third display data for display. For example, the display selection and visualization unit 138 may make a selection based on user selection provided via a user interface input (not shown) or automated selection provided by computer software and/or hardware programming for controlling display. The display selection and visualization unit 138 is also configured to generate first, second and third image data for visualizing the first, second and third display data, respectively. For example, the display selection and visualization unit 138 may include a data signal processor (DSP) for generating the first, second and third image data. The first, second and third image data are provided to the display unit 140, which is configured to display at least one of a first image visualizing the first display data, a second image visualizing the second display data and a third image visualizing the third display data. For example, the first, second and third images may be selected, e.g., via a user interface, to be displayed individually, or any two or more of the first, second and third images may be selected to be displayed simultaneously in respective segregated portions of the display unit 140.

The frequency content based trigger unit 132 is configured to apply multiple masks to the frequency domain data to provide corresponding frequency content based trigger signals. The masks identify predetermined trigger conditions to selectively identify various events in the input signal. The trigger conditions may be based on frequency ranges and/or amplitudes of the input signal in comparison with the masks, for example. The predetermined trigger conditions may define a signal bandwidth, for example, discussed below. As mentioned above, the frequency content based trigger unit 132 may also provide a frequency content based trigger signal to the acquisition control unit 120, which may stop acquiring the time domain data provided by the ADC 110 in response, thus providing traditional holding or freezing of the display of the first, second and/or third images. In addition, this allows reuse of a pre-trigger buffer memory for other trigger sources that work in the same manner, for example, including radio frequency (RF) bursts and external triggers. The frequency content based trigger unit 132 may use one of an internal trigger input and an external trigger input to generate the frequency content based trigger signals. Various implementations of the frequency content based trigger unit 132 may be configurable by the user.

In the depicted embodiment, the frequency content based trigger unit 132 is configured to provide two frequency content based trigger signals based on different corresponding predetermined trigger conditions (e.g., defined by the masks), although more or fewer trigger conditions may be included without departing from the scope of the present teachings. The frequency content based trigger unit 132 applies a first mask defining a first predetermined trigger condition, and provides a first frequency content based trigger signal when the frequency domain data (FFT spectrum) meets the first predetermined trigger condition. The frequency content based trigger unit 132 further applies a second mask defining a second predetermined trigger condition, and provides a second frequency content based trigger signal when the frequency domain data meet the second predetermined trigger condition. In addition, the frequency content based trigger unit 132 may provide a traditional frequency mask trigger signal, e.g., to trigger a batch mode capture of the frequency domain data at the acquisition control unit 120 when the frequency domain data meet a predetermined trigger condition. Although the processing unit 130 depicts a single frequency content based trigger unit 132 for purposes of illustration, it is understood that the functionality of providing the different frequency content based trigger signals may be distributed across multiple frequency content based trigger units.

The first and second frequency content based trigger signals are provided by the frequency content based trigger unit 132 to the first and second trigger based enablers 133 and 134, respectively. The first trigger based enabler 133 is configured to generate a first enable signal for selectively gating the second display engine 136 in response to the first frequency content based trigger signal, and the second trigger based enabler 134 is configured to generate a second enable signal for selectively gating the third display engine 137 in response to the second frequency content based trigger signal. The second display engine 136 stops (or pauses) generating the second display data in response to the first enable signal, effectively freezing the display of the second image on the display unit 140 at the point where the FFT spectrum meets the first predetermined trigger condition. Meanwhile, the first display engine 135 continues to generate the first display data and the third display engine 137 continues to generate the third display data (unless it has received the second enable signal), so that the first and/or third images may be continuously displayed. Likewise, the third display engine 137 stops (or pauses) generating the third display data in response to the second enable signal, effectively freezing the display of the third image on the display unit 140 at the point where the FFT spectrum meets the second predetermined trigger condition. Meanwhile, the first display engine 135 continues to generate the first display data and the second display engine 136 continues to generate the second display data (unless it has received the first enable signal, as discussed above), so that the first and/or second images may be continuously displayed.

Thus, for each FFT spectrum received from the domain conversion engine 131, the frequency content based trigger unit 132 determines whether each FFT point within that FFT spectrum meets the first and second predetermined trigger conditions. The frequency content based trigger unit 132 selectively generates the first and second enable signals corresponding to FFT spectra based on these determinations. That is, the first and second enable signals reflects when the corresponding FFT spectrum includes one or more FFT points meeting the first and second predetermined trigger conditions, respectively.

In various embodiments, the processing unit 130 may further include a density trigger unit 139. The density trigger unit 139 is connected to the third display engine 137, operating in the persistence display mode, and is configured to generate a density trigger signal based on density characteristics of the third display data. The density trigger signal is provided to the acquisition control unit 120, which may stop acquiring the time domain data provided by the ADC 110 in response to the density trigger signal, thus holding or freezing the display of the first, second and/or third images. The density trigger unit 139 may be selectively configured to act as a compare circuit or an accumulation and compare circuit, for example. In an embodiment, there is a matrix of flags with the same dimension as the third display data (e.g., persistence matrix). All persistence values of the third display data with an enabled flag are accumulated and then compared with a density trigger threshold, or each persistence value is individually compared to a density trigger threshold. In the latter case, density trigger unit 139 may generate the density trigger signal when one or all of the persistence values exceed the threshold. Various implementations of the density trigger unit 139 may be configurable by the user.

The processing unit 130 may be implemented using one or more processing devices, such as a processor, a microprocessor, a digital signal processor (DSP), one or more application specific integrated circuits (ASICs), one or more field-programmable gate arrays (FPGAs), or combinations thereof, using software, firmware, hard-wired logic circuits, or combinations thereof. The domain conversion engine 131, the frequency content based trigger unit 132, the first and second trigger based enablers 133 and 134, the first, second and third display engines 135-137, and the display selection and visualization unit 138, which are depicted separately for convenience of explanation, may be implemented as software, firmware and/or hardware modules using the same or different processing devices. The processing unit 130 may have access to memory (not shown), comprising a non-transitory, tangible computer readable medium (examples of which are discussed below) for storing operating software, modules, data and algorithms for executing the various embodiments described herein.

The real-time spectrum analyzer 100 may also include a memory unit 150, which may be configured to store any variety of frequency domain data, signaling, mask and/or trigger condition information, as desired. For example, the memory unit 150 may store all of the frequency domain data output by the domain conversion engine 131, or only the frequency domain data to be processed for display on the display unit 140. Thus, for example, in addition to selectively gating the second and third display engines 136 and 137, the first and second frequency content based trigger signals may cause the FFT spectra meeting the first and/or second predetermined trigger conditions to be selectively stored in the memory unit 150. Indeed, the memory unit 150 may be configured to store and/or buffer any frequency domain data to be processed by the first display engine 135, the second display engine 136 and/or the third display engine 137 and/or to be displayed by the display unit 140. The memory unit 150 may be any suitable type of non-transitory, tangible computer readable medium that is writable readable, including random access memory (RAM), such as static RAM (SRAM), a disk drive, a CD, a DVD, a universal serial bus (USB) drive, and the like. In an embodiment, the computer readable medium may be RAM embedded as Block RAM in the FPGAs used to implement the processing unit 130.

Figure 2A:
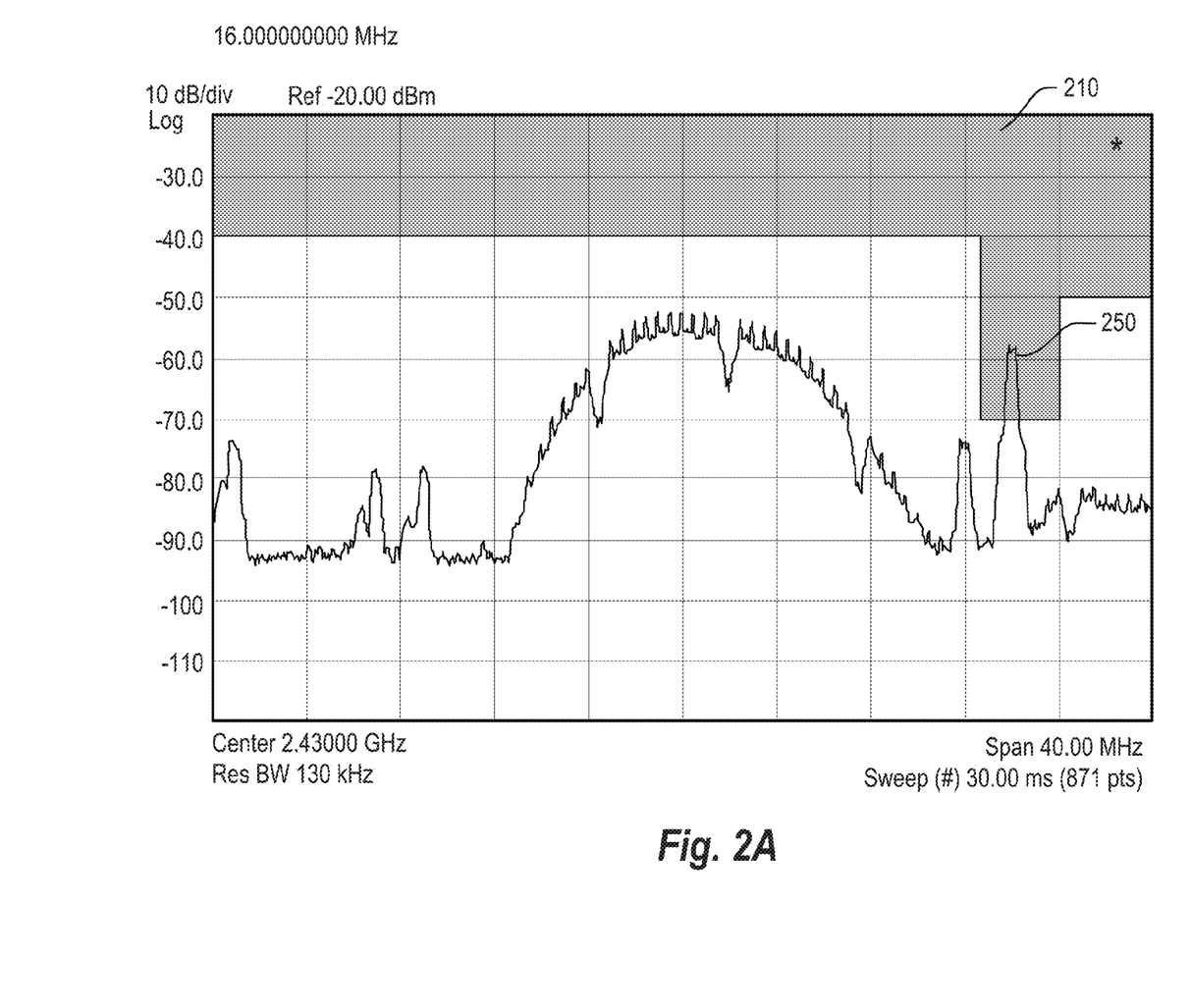
FIG. 2A is a screenshot of a spectrum obtained using a conventional frequency content based trigger unit.
Figure 2B:
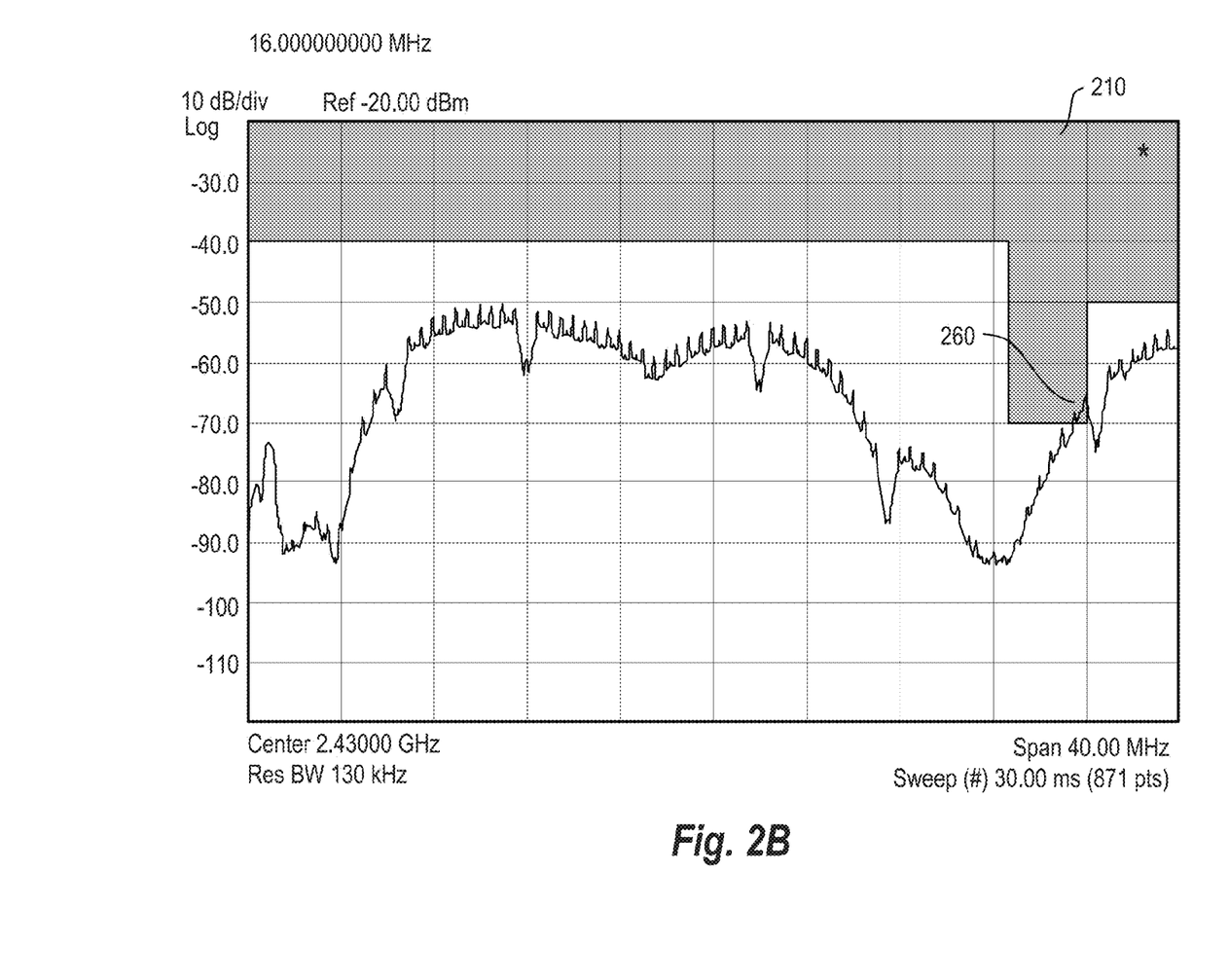
FIG. 2B is a screenshot of a spectrum obtained using a conventional frequency content based trigger unit.

In various embodiments, the real-time spectrum analyzer 100 may be used to implement even more advanced triggering to separate different signals within the same bandwidth of an input signal. FIGS. 2A and 2B are screenshots of spectrums displayed using a conventional frequency content based trigger unit, and FIG. 2C is a screenshot of a spectrum displayed using functionality of a frequency content based trigger unit, according to a representative embodiment.

FIGS. 2A and 2B show simple frequency masks configured to monitor the 2.4 GHz band. Referring to FIG. 2A, the conventional frequency mask trigger unit applies a frequency mask 210 set at a first level of −40 dB to about 2.443 GHz, a second level of −70 dB from about 2.443 GHz to about 2.446 GHz (e.g., the band for a Bluetooth signal (IEEE 802.15)), and a third level of −50 dB from about 2.446 GHz. Each of the first through third levels is fixed to absolute frequency points. The frequency mask 210 therefore causes a trigger for a Bluetooth signal 250 having a center frequency of about 2.444 GHz. Likewise, FIG. 2B depicts the frequency mask 210. However, in this case, the frequency mask 210 causes a trigger for a portion of a wireless local area network (LAN) signal 260 that happens to exceed the second level within the Bluetooth band, even though the LAN signal 260 has a significantly wider bandwidth than the Bluetooth signal 250.

Figure 2C:
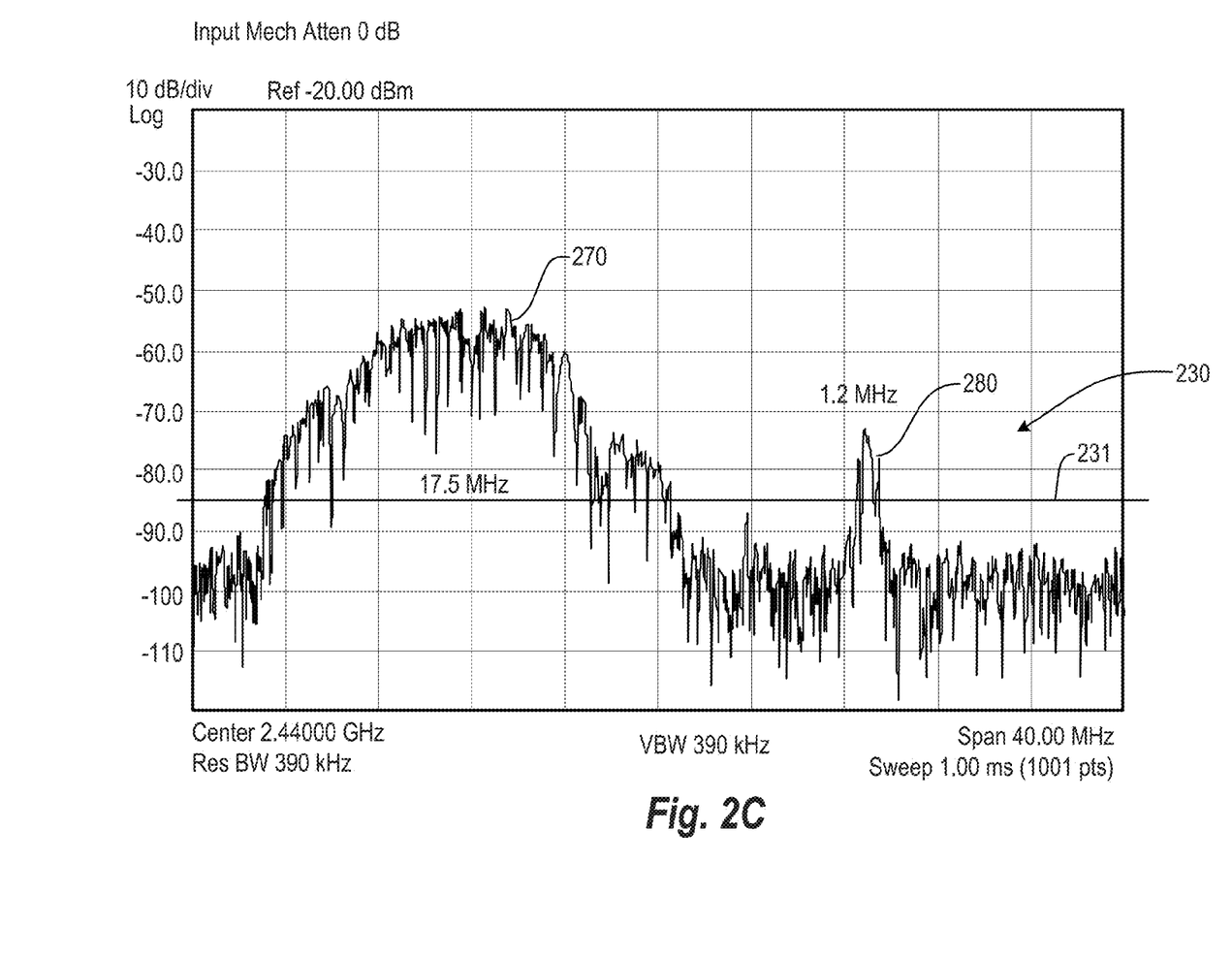
FIG. 2C is a screenshot of a spectrum obtained using functionality of a frequency content based trigger unit, according to a representative embodiment.

In comparison, as shown in FIG. 2C, the frequency content based trigger unit 132 is able to apply a complex mask based on approximate bandwidths of signals, and even the shapes of the signals (not shown in the example), based on noise level assumptions. This information can then be used to distinguish FFT spectra containing (or not containing) signals having desired signal bandwidths and shapes from those not having the desired bandwidths and shapes. In the example shown in FIG. 2B, for instance, this may be done by looking for the presence of a signal having a bandwidth larger than 5 MHz when searching for a Wi-Fi (IEEE 802.11) signal. Assuming sufficient hysteresis is applied to prevent false positives at edges of Wi-Fi signal pulses, pulses of a Bluetooth signal may be identified by looking for bandwidths between about 1 MHz and about 2 MHz. Essentially this is an extension to the masking criteria where rather than drawing an absolute frequency mask, as discussed above with reference to FIGS. 2A and 2B, only relative values are provided. This can be done in at least two dimensions: amplitude (e.g., the amount of energy above the noise level of the instrument) and frequency (e.g., the bandwidth of the signal). The masking criteria may be applied to other dimensions, as well, such as time duration, without departing from the scope of the present teachings. Referring to FIG. 2C, the frequency content based trigger unit 132 is configured to apply a simplified bandwidth detection algorithm, where a mask 230 causes a trigger each time the signal crosses a threshold line 231 set at about −85 dB (roughly 10 dB above the noise floor). Therefore, in the depicted example, the frequency content based trigger unit 132 triggers on the Wi-Fi signal 270, which exceeds the −85 dB threshold line 231 between about 2.423 GHz and about 2.441 GHz. The frequency content based trigger unit 132 also triggers on the Bluetooth signal 280, which exceeds the −85 dB threshold line 231 between about 2.449 GHz and about 2.450 GHz. Since the mask 230 is based on relative bandwidth instead of absolute frequencies, any noise from the Wi-Fi signal 270 exceeding the −85 dB threshold line 231 would not trigger within the frequency range of the Bluetooth signal 280, as long as the noise does not exceed the minimum bandwidth set for the Bluetooth signal 270 (e.g., about 1 MHz).

More particularly, according to the bandwidth detection algorithm depicted in FIG. 2C, simply crossing the −85 dB threshold line 231 generates only an internal event. In a next step, a minimum duration of 8 values (equivalent to 0.4 MHz) is enforced and only sufficiently wide events are passed to the next level. In a final step (controllable by the user), the count between the two transitions (moving above and moving below the −85 dB threshold line 231) is compared to a bandwidth trigger range. When the count exceeds the bandwidth trigger range, an external trigger event takes place, resulting in a corresponding trigger signal from the frequency content based trigger unit 132, which may be seen by the user, e.g., on the display unit 140. The earlier (internal) events may stay within the bounds of the components algorithm itself and are not necessarily accessible by external components, such as the frequency content based trigger unit 132. Also, depending on settings, the bandwidth detection algorithm may change. For instance, low pass smoothing of the FFT spectrum performs better than long minimum durations (e.g., 8 values, as mentioned above). So, another variant is setting an amplitude threshold based on maximum amplitude and calculating the distance between both ends. In various embodiments, configuration software may determine which bandwidth detection algorithm is best suited, e.g., based upon generic characteristics, such as frequency span, resolution bandwidth, and the like. However, since the bandwidth detection algorithm may change depending on settings, the user is not necessarily made aware of which bandwidth detection algorithm is being used.

The ability depicted in FIG. 2C, may be particularly helpful, for example, for quickly setting up a frequency content based trigger in the presence of hopping signals, which may have a wide range of valid absolute frequencies. Using a conventional system, the user would need to provide "holes" in the frequency mask at the frequenc(ies) of each of the hopping spots, in which case signals having other frequencies are caught only if they happen to occur outside these holes. In comparison, the various embodiments allow the frequency content based trigger unit 132 to trigger on any signal having a bandwidth different from than the undesired hopping signal, regardless of frequency. Similarly, complex triggers may be set up based on bandwidths, such as generating trigger signals for all signals wider than a first width and less than a second width, or a generating trigger signal when more than one signal is wider than the second length.

Figure 3:
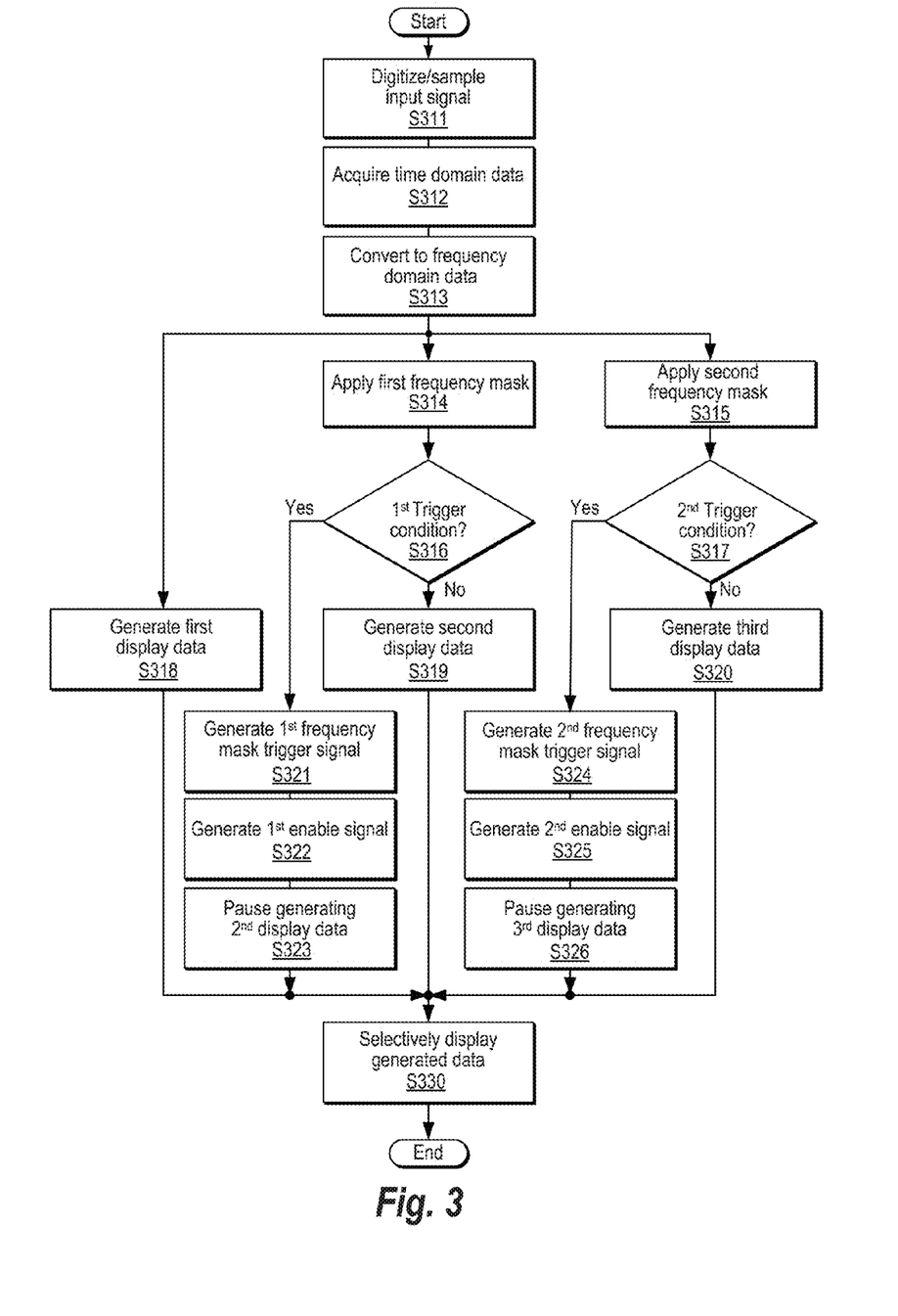
FIG. 3 is a flow diagram showing a process implemented by a real-time spectrum analyzer, according to a representative embodiment.

FIG. 3 is a flow diagram showing a method executed by a real-time spectrum analyzer for performing real-time separation of signal components of an input signal, according to a representative embodiment.

Referring to FIG. 3, in block S311, an input signal input to a real-time spectrum analyzer (e.g., real-time spectrum analyzer 100) is sampled and is digitized (e.g., by ADC 110) to obtain time domain data representative of the input signal in the time domain. The digitized signal is acquired in block S312 (e.g., by acquisition control unit 120). Acquiring the digitized signal may be responsive to a frequency content based trigger signal (e.g., from the frequency content based trigger unit 132) and/or a density content based trigger signal (e.g., from the density trigger unit 139), and/or in accordance with some other acquisition criteria. The acquired time domain data are converted to corresponding frequency domain data in block S313 (e.g., by the domain conversion engine 131). For example, FFTs may be performed on the acquired time domain data in block S313 to obtain corresponding FFT spectra representative of the input signal in the frequency domain. Each FFT spectrum contains multiple FFT points having corresponding frequencies and amplitudes. The frequency domain data represent a waveform of the input signal in the frequency domain.

In block S318, first display data are generated (e.g., by first display engine 135) from the frequency domain data in accordance with a first display mode. Likewise, in blocks S319 and S320, second and third display data are generated (e.g., by second and third display engines 136 and 137) from the frequency domain data in accordance with second and third display modes, respectively, subject to first and second trigger masks applied in blocks S314 and S515, as discussed below. The number and types of display modes may vary without departing from the scope of the present teachings. For example, the first display mode may be a traditional display mode, the second display mode may be a spectrogram display mode, and the third display mode may be a persistence display mode.

In block S314, a first mask is applied to the frequency domain data (e.g., by the frequency content based trigger unit 132), where the first mask defines a first predetermined trigger condition. It is determined in block S316 whether the frequency domain data meet the first predetermined trigger condition. When the frequency domain data do not meet the first predetermined trigger condition (block S316: No), the second display data are generated from the frequency domain data in accordance with the second display mode. When the frequency domain data do meet the first predetermined trigger condition (block S316: Yes), a first frequency content based trigger signal is generated in block S321, and a first enable signal is generated in block S322 in response to the first frequency content based trigger signal. In block S323, the generating of the second display data is paused in response to the first enable signal, e.g., after generating second display data corresponding to the frequency domain data meeting the first predetermined trigger condition. The second display data (as well as the second image data) thus may include the frequency domain data meeting the first predetermined trigger condition. In an embodiment, the second display data and the second image data may also include some frequency domain data from before the first frequency content based trigger signal. Meanwhile, the generating of the first display data continues (as does the generating of the third display data in the absence of the second enable signal).

Similarly, in block S315, a second mask is applied to the frequency domain data (e.g., by the frequency content based trigger unit 132), where the second mask defines a second predetermined trigger condition. It is determined in block S317 whether the frequency domain data meet the second predetermined trigger condition. When the frequency domain data do not meet the first predetermined trigger condition (block S317: No), the third display data are generated from the frequency domain data in accordance with the third display mode. When the frequency domain data do meet the second predetermined trigger condition (block S317: Yes), a second frequency content based trigger signal is generated in block S324, and a second enable signal is generated in block S325 in response to the second frequency content based trigger signal. In block S326, the generating of the third display data is paused in response to the second enable signal, e.g., after generating third display data corresponding to the frequency domain data that met the second predetermined trigger condition. The third display data (as well as the third image data) thus may include the frequency domain data meeting the second predetermined trigger condition. In an embodiment, the third display data and the third image data may also include some frequency domain data from before the second frequency content based trigger signal. Meanwhile, the generating of the first display data continues (as does the generating of the second display data in the absence of the first enable signal, as discussed above). Of course, although application of two trigger conditions are depicted in the example of FIG. 2, it is understood that different numbers and type of trigger conditions ma be applied, depending on application specific requirements, without departing from the scope of the present teachings.

In block S330, at least one of a first image visualizing the first display data, a second image visualizing the second display data, and a third image visualizing the third display data is selectively displayed on a display (e.g., display unit 140). In addition (or alternatively), all or a portion of the first, second and/or third display data may be stored and/or buffered by a memory (e.g., memory unit 150). Selectively displaying the first, second and third images may include any combination of desired displays. For example, the display selection and visualization unit 138 may be controlled initially to provide only the first display data for display. Then, in response to the first frequency content based trigger signal generated in block S321 or the first enable signal generated in block S322, the display selection and visualization unit 138 may provide only the second display data (e.g., frozen at the point of the first frequency content based trigger signal) or the second display data and the first display data for display. Likewise, in response to the second frequency content based trigger signal generated in block S324 or the second enable signal generated in block S325, the display selection and visualization unit 138 may provide only the third display data (e.g., frozen at the point of the second frequency content based trigger signal) or the third display data and the first display data for display. Of course, any combination of first, second and third images being displayed may be provided, without departing from the scope of the present teachings.

The various operations discussed above with reference to FIG. 3 may be included in logic executable by a computer processor or other processing device, such as the processing unit 130, discussed above, and/or some combination of processing devices (e.g., by distributed processing). The operations may be implemented using internal logic or software, stored on a computer readable medium, and executable by one or more computer processors, ASICs, FPGAs or combinations thereof, as discussed above.

Figure 4:
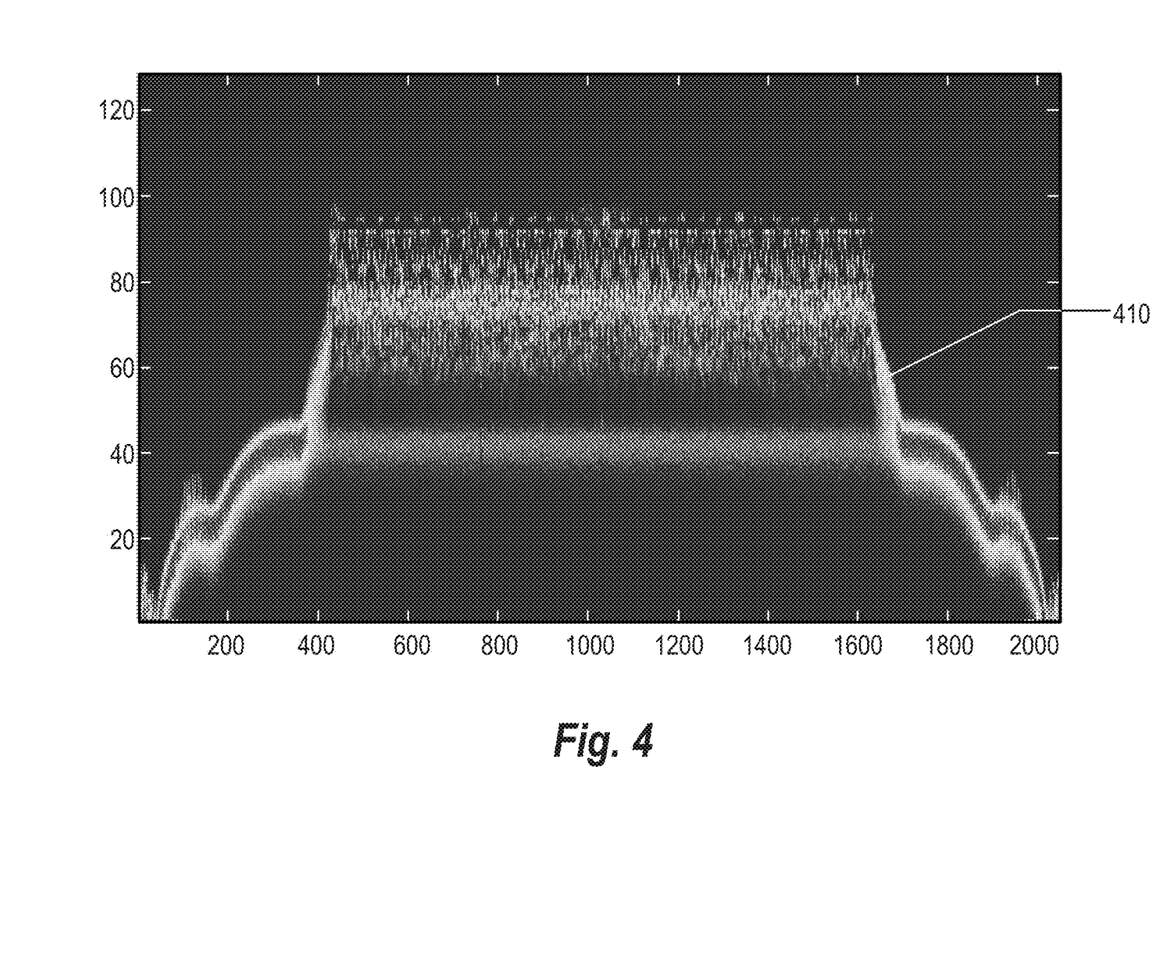
FIG. 4 is a screenshot of a spectrum obtained using a standard persistence display mode.

FIG. 4 is a screenshot of a spectrum 410 obtained using a standard persistence display mode. In particular, the spectrum 410 is an image covering the entire signal for a time domain duplex transmission of wideband (regular signal) and narrowband (synchronization signals).

Figure 5:
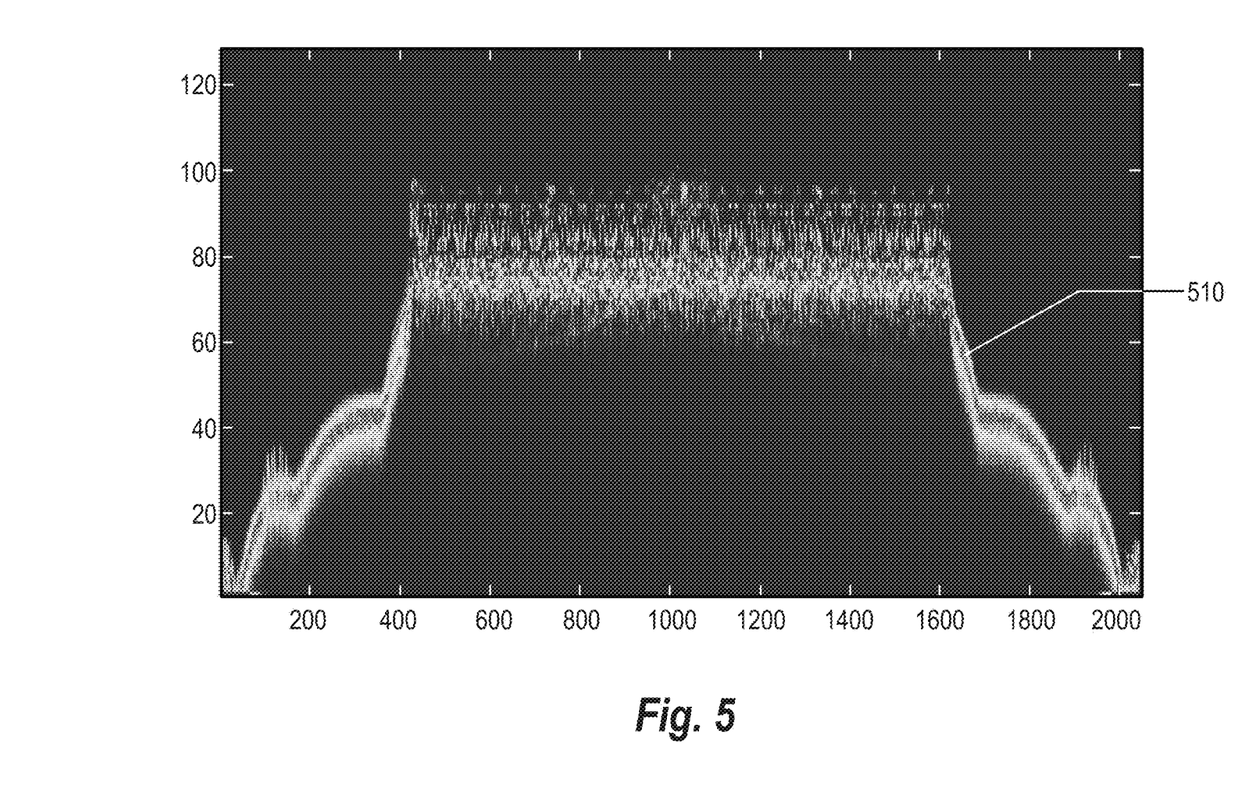
FIG. 5 is a screenshot of a spectrum obtained using persistence display mode, according to a representative embodiment.
Figure 6:
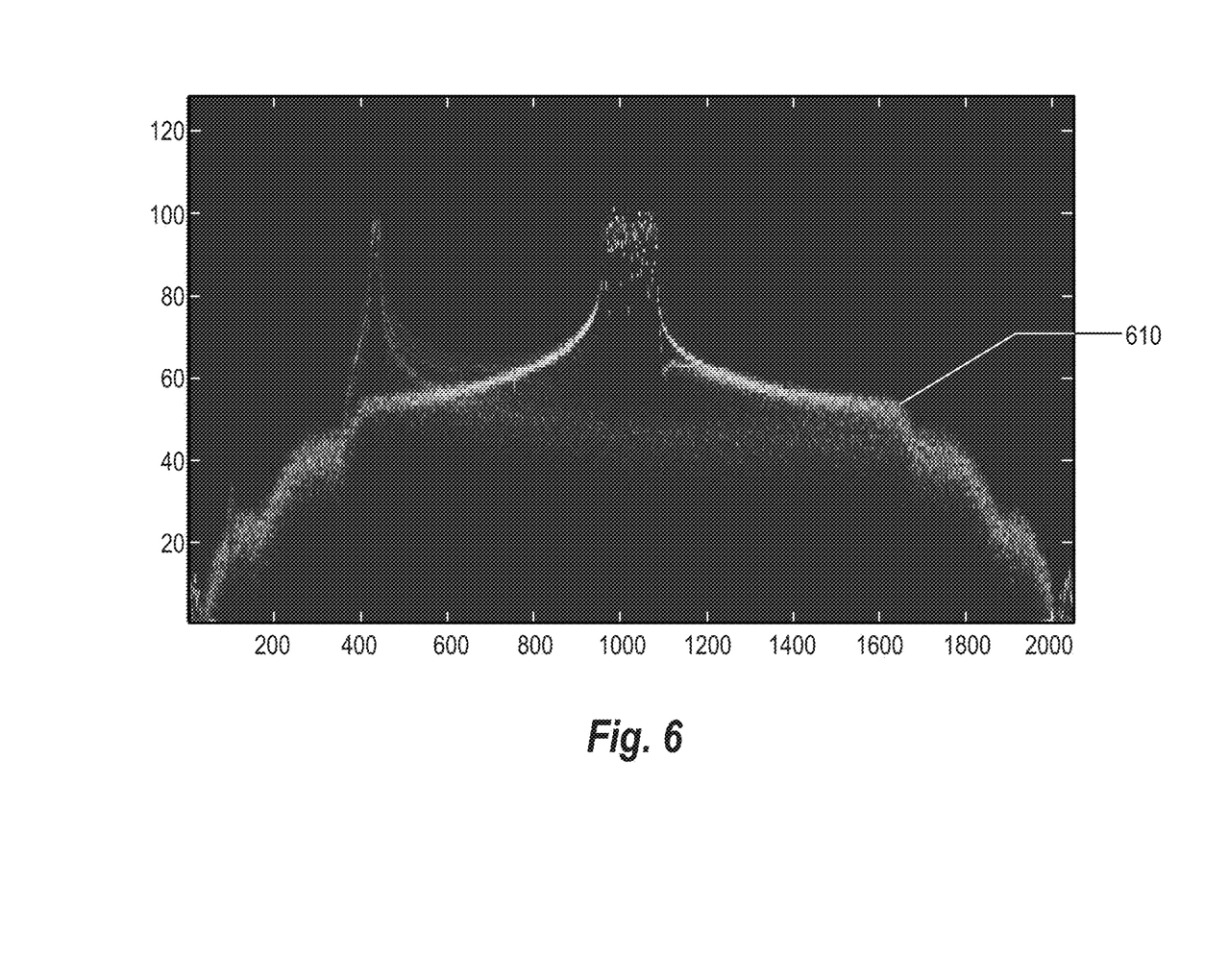
FIG. 6 is a screenshot of a spectrum displayed using persistence display mode, according to a representative embodiment.

FIGS. 5 and 6 are screenshots of spectrums 510 and 610 obtained using persistence display modes, according to representative embodiments. In FIG. 5, the spectrum 510 is a persistence display mode image in which a frequency content based trigger was set in the frequency content based trigger unit 132 to filter out the time domain duplex guard periods present in FIG. 4. In FIG. 6, the spectrum 610 is a persistence display mode image in which a frequency content based trigger was set in the frequency content based trigger unit 132 to filter out all narrowband transmissions present in FIG. 4.

As shown in the screen shots of FIGS. 5 and 6, the additional flexibility to filter out portions of the signal allows the user to isolate certain transmissions for more detailed analysis without the noisiness of other simultaneous transmissions or the inconvenience of changing the test environment to produce only the desired signals. The benefits of the additional flexibility increase with the complexity of the mask(s).

Generally, a frequency content based trigger unit that allows more complex masks, more logical combinations and more hysteresis is able to introduce more complex enable patterns. For example, a useful extension to the traditional frequency mask (e.g., one bit for each bin indicating whether they are above or below a threshold) is the addition of shape detection. In a simple illustrative embodiment, shape detection can be achieved using multiple frequency content based triggers by counting the number of consecutive bins above a mask value corresponding to a certain region of the display screen and only triggering as additional conditions are met (e.g., at least x consecutive bins or not more than y consecutive bins). The counting result may then be compared to an additional mask value, so that the real-time spectrum analyzer only triggers on signals with a bandwidth within a certain range. In addition, history in time can be kept to verify a number of consecutive occurrences within time. This information may be used as well to determine when to trigger. This may also require the addition of an additional bit per mask value to indicate whether or not this specific condition should be considered for this region of the entire bandwidth. An exemplary application of the additional flexibility is separating clean Bluetooth signals from wireless LAN signals. An additional benefit is that the addition of hysteresis by requiring consecutive violations allows the base mask values to track the noise floor more closely.

The various embodiments provide trigger based enablers that allow the input to various display engines (e.g., spectrogram and persistence display engines) to be selectively enabled or temporarily disabled based on the output of a frequency content based trigger unit. This arrangement introduces additional flexibility that allows novel use cases for the display engines and potential related density trigger. The additional cost is relatively small, as implementation only requires a single additional enable signal to be routed to each display engine, and conventional systems may even already have enabling functionality that is used for handshaking with the time to the domain conversion engine that may be modified to accommodate the various embodiments.

While the disclosure references illustrative embodiments, it will be apparent to those skilled in the art that various changes and modifications may be made without departing from the spirit and scope of the present teachings. Therefore, it should be understood that the above embodiments are not limiting, but illustrative.

What is claimed is:

1. A real-time spectrum analyzer for measuring time domain data sampled from an input signal, the real-time spectrum analyzer comprising:
    an analog-to-digital converter (ADC) configured to digitize the input signal to provide digital time domain data in a time domain;
    an acquisition control unit configured to selectively acquire the time domain data provided by the ADC in response to at least one trigger signal of a plurality of trigger signals;
    a processing unit comprising:
        a domain conversion engine configured to convert the acquired time domain data to corresponding frequency domain data representing a waveform of the input signal in a frequency domain;
        a first display engine configured to generate first display data from the frequency domain data according to a first display mode;
        a second display engine configured to selectively generate second display data from at least a portion of the frequency domain data according to a second display mode;
        a frequency content based trigger unit configured to generate a first frequency content based trigger signal in response to the frequency domain data from the domain conversion engine when the frequency domain data meet a first predetermined trigger condition; and a first trigger based enabler configured to generate a first enable signal for selectively gating the second display engine in response to the first frequency content based trigger signal, such that the second display engine stops generating the second display data in response to the first enable signal, while the first display engine continues to generate the first display data; and a display unit configured to display at least one of a first image visualizing the first display data and a second image visualizing the second display data.

2. The real-time spectrum analyzer of claim 1, wherein the second image displayed by the display unit freezes when the second display engine stops generating the second display data in response to the first enable signal.

3. The real-time spectrum analyzer of claim 2, wherein the first image is continuously displayed regardless of whether the second display engine stops generating the second display data in response to the first enable signal.

4. The real-time spectrum analyzer of claim 1, wherein the frequency content based trigger unit is further configured to generate a second frequency content based trigger signal when the frequency domain data meet a second predetermined trigger condition, and wherein the processing unit further comprises:
a third display engine configured to selectively generate third display data from at least a portion of the frequency domain data according to a third display mode; and a second trigger based enabler configured to generate a second enable signal for selectively disabling the third display engine in response to the second frequency content based trigger signal, such that the third display engine stops generating the third display data in response to the second enable signal, while at least the first display engine continues to generate the first display data.

5. The real-time spectrum analyzer of claim 4, wherein the display unit is further configured to display a third image visualizing the third display data.

6. The real-time spectrum analyzer of claim 5, wherein the first display mode of the first display engine comprises a traditional display mode in which a single spectrum is displayed.

7. The real-time spectrum analyzer of claim 6, wherein the second display mode of the second display engine comprises a persistence display mode, in which underlying data comprise a matrix of occurrence values of each point in a plurality of spectra.

8. The real-time spectrum analyzer of claim 7, wherein the third display mode of the third display engine comprises a spectrogram display mode, in which a plurality of spectra are displayed simultaneously.

9. The real-time spectrum analyzer of claim 7, wherein the processing unit further comprises:
a density trigger unit connected to the second display engine and configured to generate a density trigger signal based on comparison of persistence values points in a plurality of spectra to a density trigger threshold.

10. The real-time spectrum analyzer of claim 9, wherein the density trigger signal is provided to the acquisition control unit, which stops acquiring the time domain data provided by the ADC in response to the density trigger signal.

11. The real-time spectrum analyzer of claim 1, wherein the domain conversion engine comprises a fast Fourier transform (FFT) engine configured to perform FFTs on the acquired time domain data to provide a corresponding plurality of FFT points representing the waveform of the input signal in the frequency domain.

12. The real-time spectrum analyzer of claim 11, wherein the frequency content based trigger unit generates the first frequency content based trigger signal when at least one FFT point of the plurality of FFT points meets the first predetermined trigger condition.

13. The real-time spectrum analyzer of claim 12, wherein each FFT point f the plurality of FFT points comprises a frequency and a corresponding amplitude of the input signal.

14. The real-time spectrum analyzer of claim 1, wherein the frequency content based trigger unit uses one of an internal trigger input and an external trigger input to generate the first frequency content based trigger signal.

15. The real-time spectrum analyzer of claim 1, wherein each of the domain conversion engine, the first and second display engines, the frequency content based trigger unit and the first trigger based enabler are comprised of one or more field-programmable gate arrays (FPGAs).

16. A method executed by a real-time spectrum analyzer for performing real-time separation of signal components of an input signal, the method comprising:
digitizing the input signal to obtain time domain data;
acquiring the time domain data in response to at least one trigger signal of a plurality of trigger signals;
converting the acquired time domain data to corresponding frequency domain data representing a waveform of the input signal in a frequency domain;
generating first display data from the frequency domain data according to a traditional display mode;
generating second display data from the frequency domain data according to one of a persistence display mode or a spectrogram display mode;
generating a first frequency content based trigger signal in response to the frequency domain data from a domain conversion engine, when the frequency domain data meets a first predetermined trigger condition;
generating a first enable signal in response to the first frequency content based trigger signal;
pausing the generating of the second display data in response to the first enable signal, while continuing to generate the first display data; and
displaying at least one of a first image visualizing the first display data and a second image visualizing the second display data.

17. The method of claim 16, further comprising:
generating third display data from the frequency domain data according to one of the spectrogram display mode or the persistence display mode;
generating a second frequency content based trigger signal when the frequency domain data meet a second predetermined trigger condition;
generating a second enable signal in response to the second frequency content based trigger signal; and
pausing the generating of the third display data in response to the second enable signal, while continuing to generate at least the first display data.

18. The method of claim 16, further comprising:
generating a density trigger signal based on density characteristics of the second image; and
disabling the acquiring of the time domain data in response to the density trigger signal.

19. A real-time spectrum analyzer for measuring time domain data sampled from an input signal, the real-time spectrum analyzer comprising:
- a domain conversion engine configured to convert digitized time domain data to corresponding fast Fourier transform (FFT) spectra representing a waveform of the input signal in a frequency domain;
- a plurality of display engines configured to generate a plurality of display data from the FFT spectra according to a corresponding plurality of display modes;
- a frequency content based trigger unit configured to apply first and second masks defining first and second predetermined trigger conditions in response to the frequency domain input signal, and to generate a first frequency content based trigger signal when an FFT point in at least one FFT spectrum meets the first predetermined trigger condition, and to generate a second frequency content based trigger signal when an FFT point in at least one FFT spectrum meets the second predetermined trigger condition;
- a first trigger based enabler configured to generate a first enable signal for selectively gating one of the plurality of display engines in response to the first frequency content based trigger signal, independent of at least one other display engine, while at least one more display engine continues to generate display data; and
- a second trigger based enabler configured to generate a second enable signal for selectively gating another one of the plurality of display engines in response to the second frequency content based trigger signal, independent of at least one other display engine.

20. The real-time spectrum analyzer of claim 19, wherein first and second predetermined trigger conditions define a signal bandwidth.

* * * * *